United States Patent
Iwai

(10) Patent No.: US 7,995,389 B2
(45) Date of Patent: Aug. 9, 2011

(54) MULTI-LEVEL NONVOLATILE SEMICONDUCTOR MEMORY

(75) Inventor: Makoto Iwai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 12/563,274

(22) Filed: Sep. 21, 2009

(65) Prior Publication Data

US 2010/0128526 A1     May 27, 2010

(30) Foreign Application Priority Data

Nov. 27, 2008 (JP) ................................ 2008-302758

(51) Int. Cl.
*G11C 16/04*     (2006.01)

(52) U.S. Cl. ......... 365/185.03; 365/185.19; 365/185.17; 365/185.22; 365/185.21

(58) Field of Classification Search ............. 365/185.03, 365/185.19, 185.17, 185.22, 185.21
See application file for complete search history.

(56) References Cited

U.S. PATENT DOCUMENTS

| | | | |
|---|---|---|---|
| 6,434,055 B2 | 8/2002 | Tanaka et al. | |
| 7,359,245 B2 | 4/2008 | Kim et al. | |
| 7,369,437 B2 | 5/2008 | Kamei | |
| 7,529,131 B2 | 5/2009 | Iwai et al. | |
| 2004/0109357 A1 | 6/2004 | Cernea et al. | |
| 2009/0073763 A1* | 3/2009 | Hosono | 365/185.03 |

* cited by examiner

*Primary Examiner* — Thong Q Le
(74) *Attorney, Agent, or Firm* — Oblon, Spivak, McClelland, Maier & Neustadt, L.L.P.

(57) ABSTRACT

A memory includes first and second select gate transistors, memory cells which are connected in series between the first and second select gate transistors, a selected word line which is connected to a selected memory cell as a target of a reading, a non-selected word line which is connected to a non-selected memory cell except the selected memory cell, a potential generating circuit for generating a selected read potential which is supplied to the selected word line, and generating a non-selected read potential larger than the selected read potential, which is supplied to the non-selected word line, and a control circuit which changes a set up term of the selected word line and the non-selected word line based on a value of the selected read potential, wherein the value of the selected read potential is selected from two or more potentials.

15 Claims, 13 Drawing Sheets

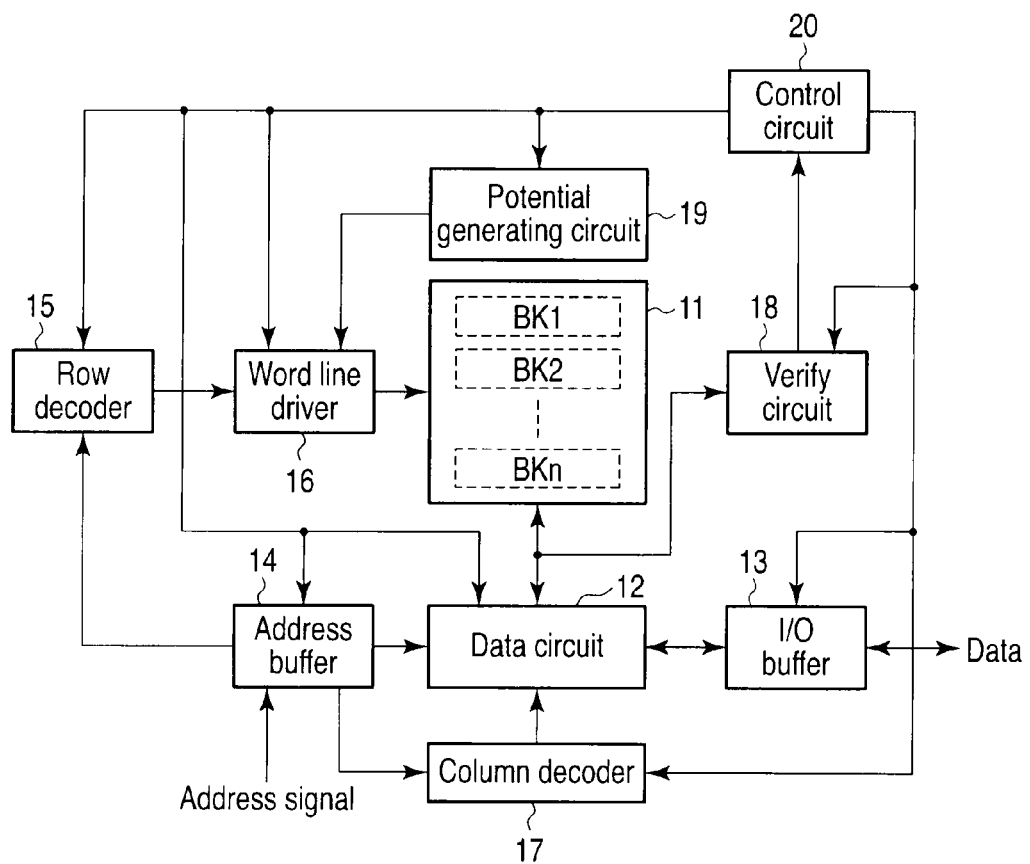
F I G. 1

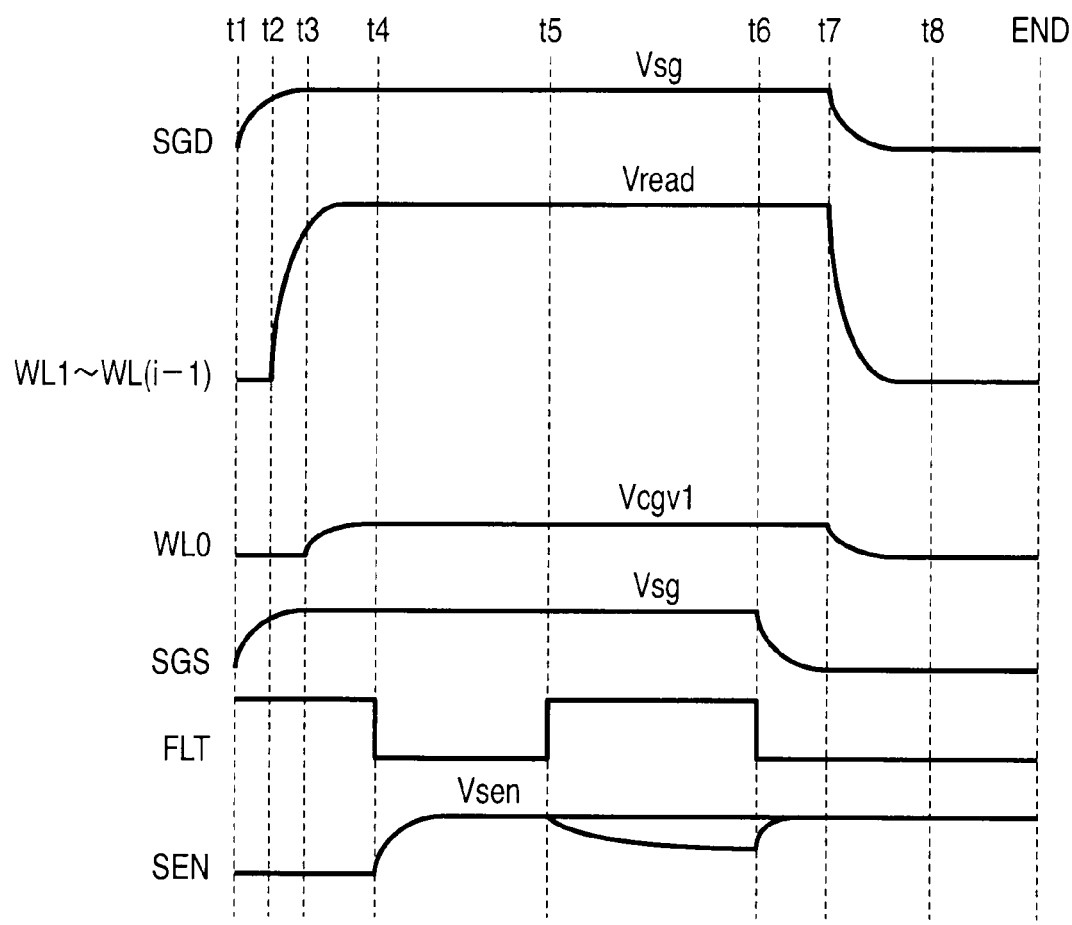
F I G. 10

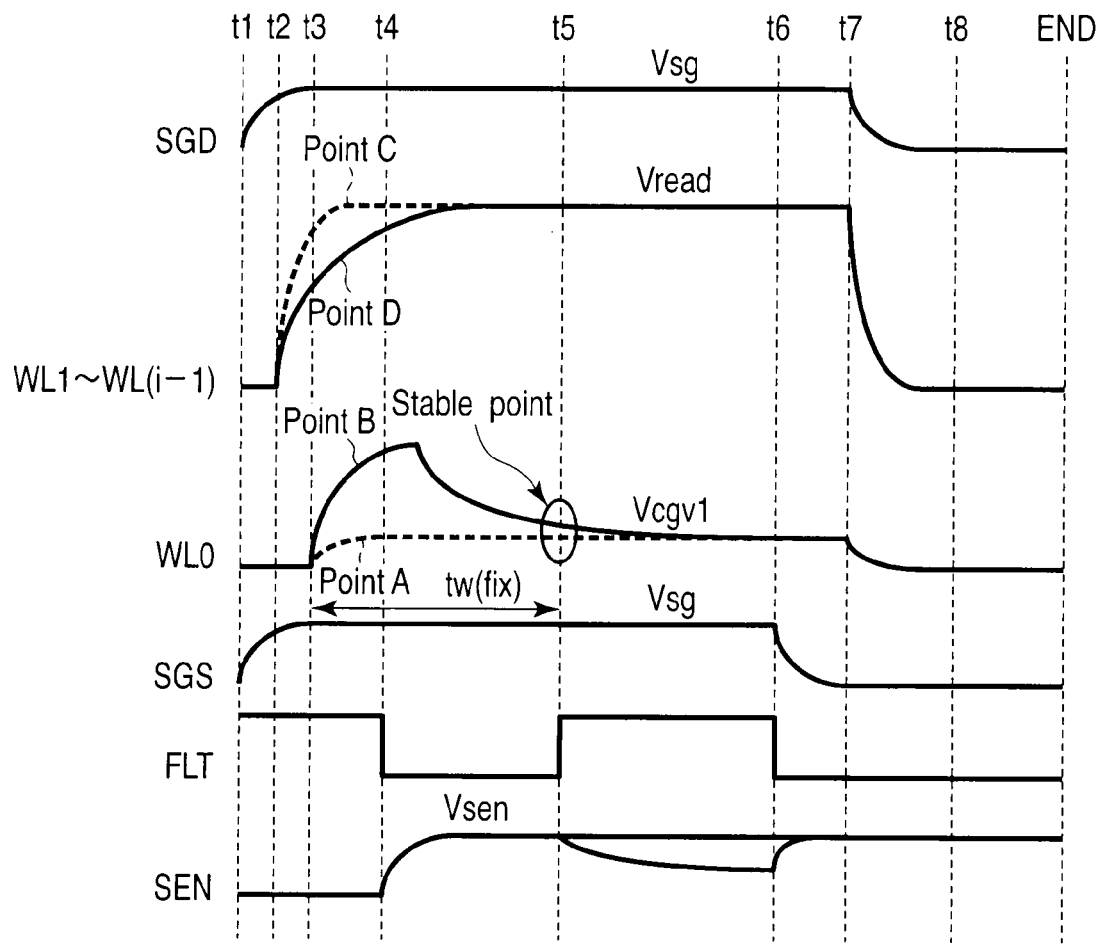
F I G. 11

Relationship between verify read potential Vcgv of selected word line and set up term tw

| Vcgv | tw |
|---|---|
| Vcgv1 | tw1 |
| Vcgv2 | tw2 |
| Vcgv3 | tw3 |
| ⋮ | ⋮ |
| Vcgv(n−1) | tw(n−1) |

Vcgv1 < Vcgv2 < Vcgv3 < ⋯ Vcgv(n−1)
tw1 > tw2 > tw3 > ⋯ tw(n−1)

F I G. 15

MULTI-LEVEL NONVOLATILE SEMICONDUCTOR MEMORY

CROSS-REFERENCE TO RELATED APPLICATIONS

This application is based upon and claims the benefit of priority from prior Japanese Patent Application No. 2008-302758, filed Nov. 27, 2008, the entire contents of which are incorporated herein by reference.

BACKGROUND OF THE INVENTION

1. Field of the Invention

The present invention relates to a read operation of a multi-level nonvolatile semiconductor memory.

2. Description of the Related Art

In a nonvolatile semiconductor memory in which one cell unit is configured by memory cells, e.g., a NAND flash memory (e.g., see the specification of U.S. Patent Application Publication No. 2004/0109357), with an increase in the packing density of a memory cell array, several problems arise, caused by the wiring resistance of word lines in one cell unit and parasitic capacitance between the word lines.

One of the problems is a prolonged set up term of word lines upon reading.

The term "set up term of word lines" as used herein refers to a term from when a selected read potential begins to be supplied to a selected word line until sensing begins.

The term "selected read potential" refers to a potential to which on/off of a selected memory cell serving as a target of a reading is determined based on data in the memory cell. The expression "sensing begins" refers to that the potentials of bit lines begin to be brought to values based on data in selected memory cells or data in memory cells begin to be sensed by a sense amplifier.

Furthermore, when it is simply said "reading", it includes both normal reading and verify reading. The term "normal reading" refers to that data in memory cells are output external to the chip. The term "verify reading" refers to that reading is performed to verify whether data is written properly upon writing.

When the packing density of a memory cell array increases, word lines in one cell unit become thinner, narrower, and longer, increasing wiring resistance. In addition, the distances between the word lines become narrower, increasing parasitic capacitance.

Under such circumstances, it takes a certain amount of time for a non-selected read potential to be thoroughly transmitted from one end (the nearest end to a word line driver) of a non-selected word line to the other end (the farthest end from the word line driver), that is, a waveform of the rise of the potential of the other end of the non-selected word line is gradual.

The term "non-selected read potential" refers to a potential which turns on a non-selected memory cell which does not serve as a target of reading, regardless of the threshold voltage of the memory cell and is larger than a selected read potential to be supplied to a selected word line.

Hence, due to the rise of the potential of the other end of the non-selected word line, the potential of the other end of the selected word line rises to near the non-selected read potential by capacitive coupling between the selected word line and the non-selected word line adjacent thereto.

In addition, as described above, since the waveform of the rise of the potential of the other end of the non-selected word line is gradual, even after a selected read potential is supplied to one end of the selected word line, the potential of the other end of the selected word line is influenced by the potential of the other end of the non-selected word line and thus maintains a potential near the non-selected read potential.

Therefore, it takes a very long time for the potential of the selected word line to drop from the potential near the non-selected read potential and finally settle to the selected read potential.

Meanwhile, to prevent erroneous reading, sensing cannot begin until the potential of the other end of the selected word line reaches the selected read potential.

Due to such reasons, the set up term of word lines is prolonged.

Particularly, in a multi-level nonvolatile semiconductor memory having memory cells, each storing three or more level data, a selected read potential to be supplied to a selected word line has two or more values. That is, as the number of data to be stored in one memory cell increases, the difference between the value of a non-selected read potential and the lowest value of the selected read potential becomes larger.

Therefore, when the selected read potential has the lowest value, a term during which the potential of the other end of the selected word line changes from near the non-selected read potential to the selected read potential is longest.

The set up term of word lines is fixed to the above-described longest term, regardless of the value of the selected read potential.

Accordingly, in a multi-level nonvolatile semiconductor memory, a prolonged set up term of word lines due to an increase in the packing density of a memory cell array is particularly noticeable.

Such a prolonged set up term of word lines becomes an inhibiting factor to a high speed of a read operation.

BRIEF SUMMARY OF THE INVENTION

A multi-level nonvolatile semiconductor memory according to an aspect of the present invention comprises first and second select gate transistors, memory cells each stores three or more level data, which are connected in series between the first and second select gate transistors, a selected word line which is connected to a selected memory cell as a target of a reading among the memory cells, a non-selected word line which is connected to a non-selected memory cell except the selected memory cell among the memory cells, a potential generating circuit for generating a selected read potential which is supplied to the selected word line, and generating a non-selected read potential larger than the selected read potential, which is supplied to the non-selected word line, and a control circuit which changes a set up term of the selected word line and the non-selected word line based on a value of the selected read potential, wherein the value of the selected read potential is selected from two or more potentials.

BRIEF DESCRIPTION OF THE SEVERAL VIEWS OF THE DRAWING

FIG. 1 is a diagram showing a multi-level nonvolatile semiconductor memory.

FIGS. 10 and 11 are diagrams, each showing a waveform of a selected word line to which Vcgv1 is supplied.

FIG. 15 is a diagram showing a relationship between a selected read potential and a set up term.

DETAILED DESCRIPTION OF THE INVENTION

Figure 2:
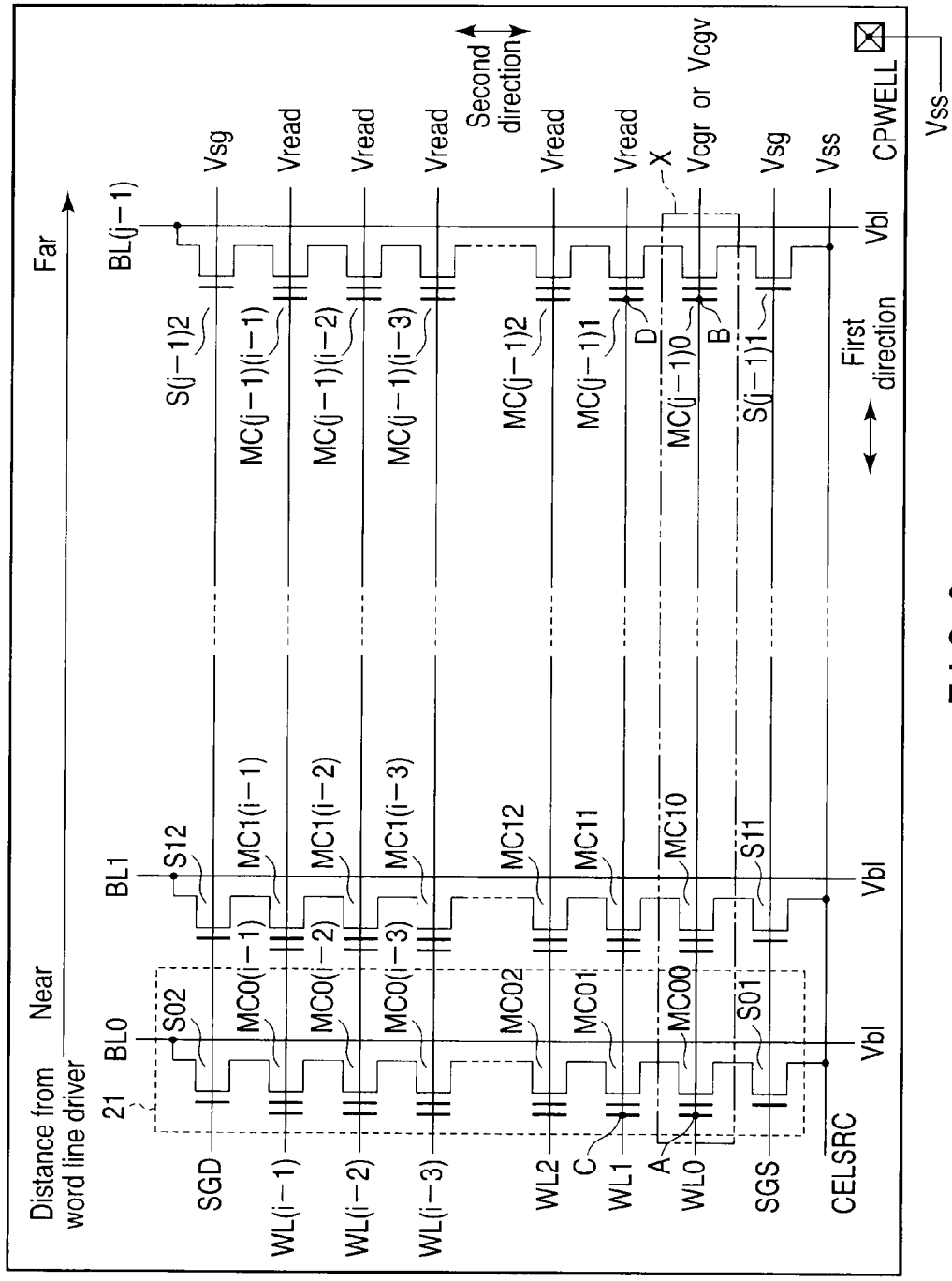
FIG. 2 is a diagram showing one NAND block.

A multi-level nonvolatile semiconductor memory of an aspect of the present invention will be described below in detail with reference to the accompanying drawing.

1. Outline

An example of the present invention is characterized by changing a set up term of word lines based on a value of a selected read potential in a multi-level nonvolatile semiconductor memory having a memory cell which stores three or more level data.

The value of the selected read potential is selected from two or more potentials and a term which a potential of one end (the farthest end form a word line driver) of a selected word line changes from a non-selected read potential to the selected read potential is variable in a multi-level nonvolatile semiconductor memory.

Therefore, the set up term of the word lines changes based on the value of the selected read potential in an example of the present invention.

Specifically, the term which the potential of one end of the selected word line changes from the non-selected read potential to the selected read potential shorten in proportion to an increase of the value of the selected read potential. And, the set up term of the word lines shorten in proportion to an increase of the value of the selected read potential too.

Therefore, a high speed of a read operation is realized by an example of the present invention in comparison with the conventional technique which the set up term of the word lines is fixed.

2. Multi-Level Nonvolatile Semiconductor Memory

First, a multi-level nonvolatile semiconductor memory which serves as a premise of the present invention will be described using a multi-level NAND flash memory as an example.

FIG. 1 shows a multi-level NAND flash memory.

Memory cell array 11 has NAND blocks BK1, BK2, ... BKn. Each of NAND blocks BK1, BK2, ... BKn has NAND cell units.

Data circuit 12 has latch circuits (page buffers) which temporarily latch page data upon reading/writing. I/O (Input/ Output) buffer 13 functions as an interface circuit for data, and address buffer 14 functions as an interface circuit for address signals.

The address signals include a block address signal, a row address signal, and a column address signal.

Row decoder 15 selects one of blocks BK1, BK2, ... BKn based on a block address signal and selects one of word lines in the selected block based on a row address signal.

Word line driver 16 drives word lines in the selected block.

Column decoder 17 selects a predetermined number of latch circuits from the latch circuits based on a column address signal and connects the selected predetermined number of latch circuits to I/O buffer 13.

Verify circuit 18 verifies whether data is written properly upon writing. Verify circuit 18 compares data read from a selected memory cell upon verify reading with written data to determine whether writing has been completed.

Upon reading, potential generating circuit 19 generates a selected read potential which is supplied to a selected word line, and generates a non-selected read potential larger than the selected read potential, which is supplied to a non-selected word line.

Control circuit 20 controls the operations of data circuit 12, I/O buffer 13, address buffer 14, row decoder 15, word line driver 16, column decoder 17, verify circuit 18, and potential generating circuit 19.

FIG. 2 shows one NAND block in a memory cell array.

NAND cell unit 21 includes source line side select gate transistor S01, bit line side select gate transistor S02, and i (i is a natural number greater than or equal to 2) memory cells MC00, MC01, MC02, ... MC0(i−3), MC0(i−2), and MC0(i−1) which are connected in series between source line side select gate transistor S01 and bit line side select gate transistor S02.

Two select gate lines SGS and SGD and i word lines WL0, WL1, WL2, ... WL(i−3), WL(i−2), and WL(i−1) extend in a first direction. j (j is a natural number greater than or equal to 2) bit lines BL0, BL1, ... BL(j−1) extend in a second direction orthogonal to the first direction.

Source line side select gate transistor S01 is connected to source line CELSRC and bit line side select gate transistor S02 is connected to bit line BL0.

The memory cell array is disposed in well region CPWELL.

3. Principle of Present Invention

The principle of the present invention will be described using, as an example, the above-described multi-level NAND flash memory shown in FIGS. 1 and 2.

For simplification, in the following description, four levels are premised.

Figure 3:
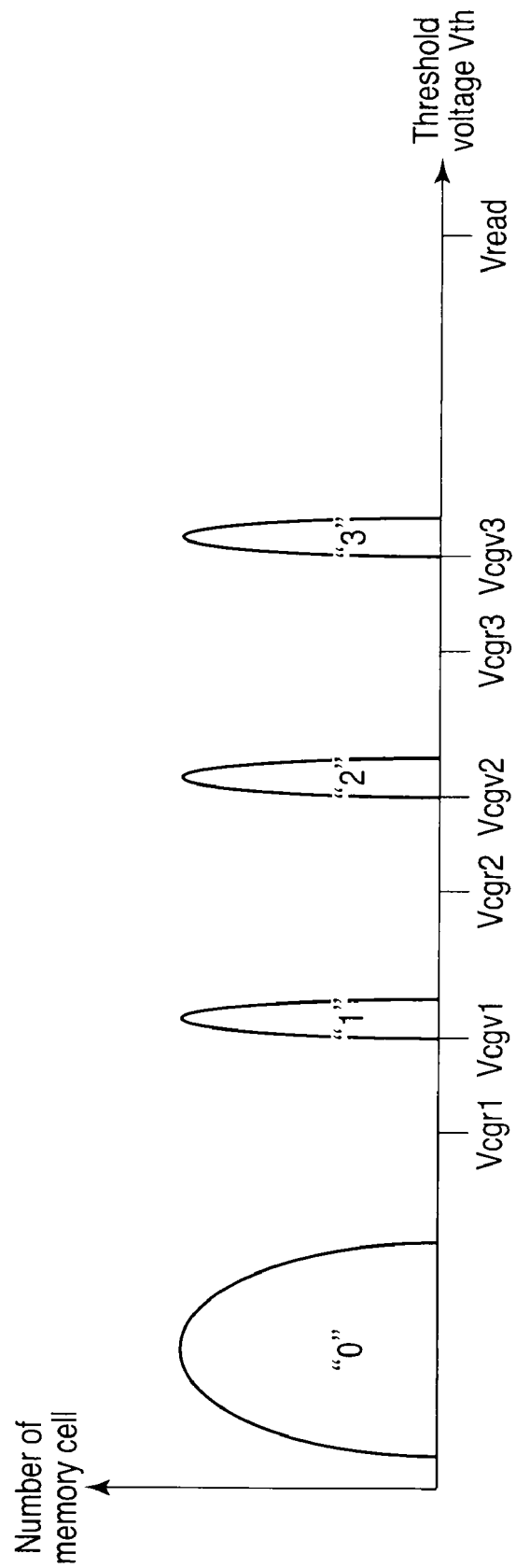
FIG. 3 is a diagram showing a distribution of threshold voltages of memory cells.

As shown in FIG. 3, a state in which the threshold voltages of memory cells are lowest is an erase state (state "0") and there are three write states (state "1", state "2", and state "3"). The state in which the threshold voltages of memory cells are highest is state "3" and the threshold voltages of memory cells in state "2" are lower than the threshold voltages of memory cells in state "3" and the threshold voltages of memory cells in state "1" are lower than the threshold voltages of memory cells in state "2".

The initial state of memory cells is an erase state.

In FIG. 2, it is assumed that a selected word line is WL0 and non-selected word lines are WL1, WL2, ... WL(i−3), WL(i−2), and WL(i−1). j memory cells MC00, MC10, ... MC(j−1)0 in range X which are connected to selected word line WL0 are selected memory cells.

A potential relationship at the point in time when sensing begins is as shown in FIG. 2.

Upon normal reading, selected word line WL0 is set to selected read potential Vcgr and non-selected word lines WL1, WL2, . . . WL(i−3), WL(i−2), and WL(i−1) are set to non-selected read potential Vread.

Note that Vread (e.g., 5 to 7 V)>Vcgr (e.g., 0 to 4 V).

The value of Vcgr is, as shown in FIG. 3, one selected from three values Vcgr1, Vcgr2, and Vcgr3 (for four values).

Two select gate lines SGS and SGD are set to select gate potential Vsg (e.g., 3.5 to 7 V) which turns them on. Source line CELSRC and well region CPWELL are set to ground potential Vss or predetermined potential, and bit lines BL0, BL1, . . . BL(j−1) are set to precharge potential Vbl, for example.

Thereafter, the potentials of bit lines BL0, BL1, . . . BL(j−1) respectively change based on the threshold voltages of selected memory cells MC00, MC10, . . . MC(j−1)0.

Upon verify reading, selected word line WL0 is set to selected read potential Vcgv and non-selected word lines WL1, WL2, . . . WL(i−3), WL(i−2), and WL(i−1) are set to non-selected read potential Vread.

Note that Vread (e.g., 5 to 7 V)>Vcgv (e.g., 0 to 4 V).

The value of Vcgv is, as shown in FIG. 3, one selected from three values Vcgv1, Vcgv2, and Vcgv3 (for four values).

Two select gate lines SGS and SGD are set to select gate potential Vsg (e.g., 3.5 to 7 V) which turns them on. Source line CELSRC and well region CPWELL are set to ground potential Vss or predetermined potential, and bit lines BL0, BL1, . . . BL(j−1) are set to precharge potential Vbl, for example.

Thereafter, the potentials of bit lines BL0, BL1, . . . BL(j−1) respectively change based on the threshold voltages of selected memory cells MC00, MC10, . . . MC(j−1)0.

Here, waveforms of potentials at points A and B in the memory cell array for when Vcgv1 and Vcgv3 are supplied to selected word line WL0 are considered.

As shown in FIG. 2, point A is the nearest point of selected word line WL0 to the word line driver (specifically, a control gate electrode of selected memory cell MC00 nearest to the word line driver) and point B is the farthest point of selected word line WL0 from the word line driver (specifically, a control gate electrode of selected memory cell MC(j−1)0 which is farthest from the word line driver).

Figure 4:
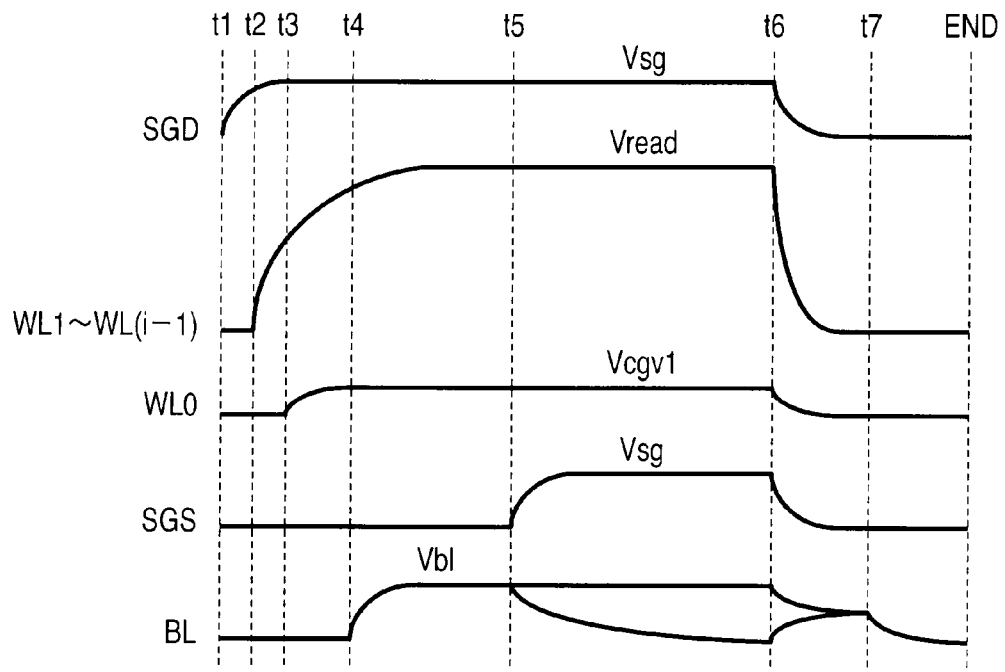
FIGS. 4 and 5 are diagrams, each showing a waveform of a selected word line to which Vcgv1 is supplied.

FIG. 4 shows a first example of waveforms for when Vcgv1 is supplied to selected word line WL0.

In the first example, for selected word line WL0, a change in waveform at point A in the memory cell array is shown and for non-selected word line WL1, a change in waveform at point C in the memory cell array is shown.

First, at time t1, the gate potential of the bit line side select gate transistor (the potential of the select gate line SGD) begins to rise to Vsg.

Thereafter, at time t2 the potentials of non-selected word lines WL1 to WL(i−1) begin to rise to Vread, and at time t3 the potential of selected word line WL0 begins to rise to Vcgv1.

At time t4, the potentials of bit lines BL begin to rise to precharge potential Vbl. Furthermore, after the potentials of all bit lines BL rise to precharge potential Vbl, bit lines BL are brought into a floating state.

Here, bit lines BL may be all bit lines BL0 to BL(j−1) in FIG. 2 or may be bit lines selected from these bit lines BL0 to BL(j−1).

Then, at time t5, sensing begins.

Specifically, the gate potential of the source line side select gate transistor (the potential of the select gate line SGS) is brought to Vsg.

At this time, when the threshold voltage of a selected memory cell is lower than Vcgv1, the selected memory cell is in an on state and thus the potential of corresponding bit line BL drops from precharge potential Vbl. On the other hand, when the threshold voltage of a selected memory cell is higher than Vcgv1, the selected memory cell is in an off state and thus the potential of corresponding bit line BL is maintained at precharge potential Vbl.

Such potential changes are sensed by a sense amplifier.

Finally, at time t6, the potentials of all word lines WL0 to WL(i−1) and two select gate lines SGS and SGD fall, bringing them to ground potential Vss. The potentials of bit lines BL are equalized and thereafter, at time t7, drop to ground potential Vss.

Figure 5:
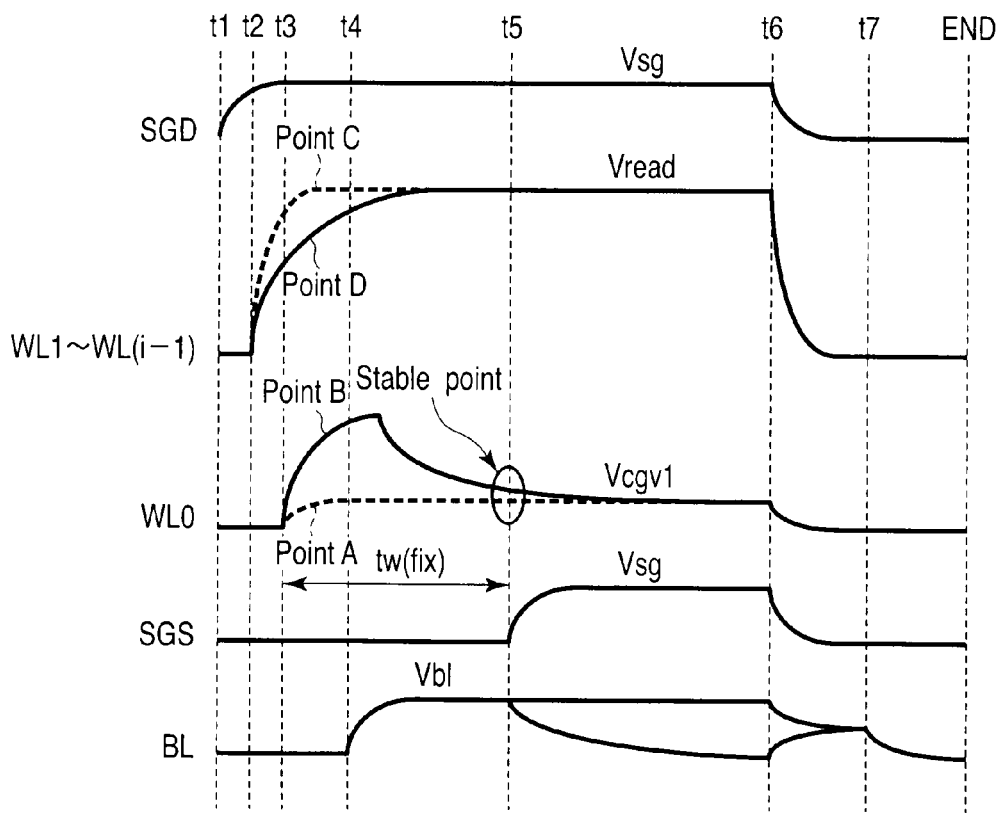

FIG. 5 shows a second example of waveforms for when Vcgv1 is supplied to selected word line WL0.

In the second example, for selected word line WL0, changes in waveforms at points A and B in the memory cell array are shown in a comparative manner and for non-selected word line WL1, changes in waveforms at points C and D in the memory cell array are shown in a comparative manner.

Waveforms at points B and D differ from waveforms at points A and C in a range of times t2 to t5. Dashed lines indicate waveforms at points A and C and solid lines indicate waveforms at points B and D.

At time t2, when non-selected read potential Vread is supplied to one ends of respective non-selected word lines WL1 to WL(i−1), at point C which is nearest to the word line driver, the potentials of non-selected word lines WL1 to WL(i−1) suddenly rise and immediately reach Vread.

On the other hand, at point D which is farthest from the word line driver, the potentials of non-selected word lines WL1 to WL(i−1) gradually rise due to the influence of wiring resistance and wiring capacitance.

At time t3, when selected read potential Vcgv1 is supplied to one end of selected word line WL0, at point A the potential of selected word line WL0 immediately reaches Vcgv1. At point B, however, since it requires a considerable amount of time for Vcgv1 to be transmitted from point A to point B, the potential does not immediately reach Vcgv1.

Meanwhile, since the potential of non-selected word line WL1 at point D gradually rises due to the influence of wiring resistance and wiring capacitance, the potential of selected word line WL0 at point B overshoots to near Vread by capacitive coupling between selected word line WL0 and non-selected word line WL1.

Thus, to prevent erroneous reading, sensing cannot begin until the potential at point B drops to Vcgv1 from near Vread. That is, set up term tw (fix) of word lines from when Vcgv1 begins to be supplied to selected word line WL0 until sensing begins is required.

Here, the point in time when the potential at point B reaches Vcgv1 is referred to as a "stable point". The potential at point B reaching Vcgv1 indicates that the potential at point B falls within a range of Vcgv1±α. The value of α is, for example, 10% of the value of Vcgv1. If Vcgv1 is 0.5 V, α is 0.05 V.

Figure 6:
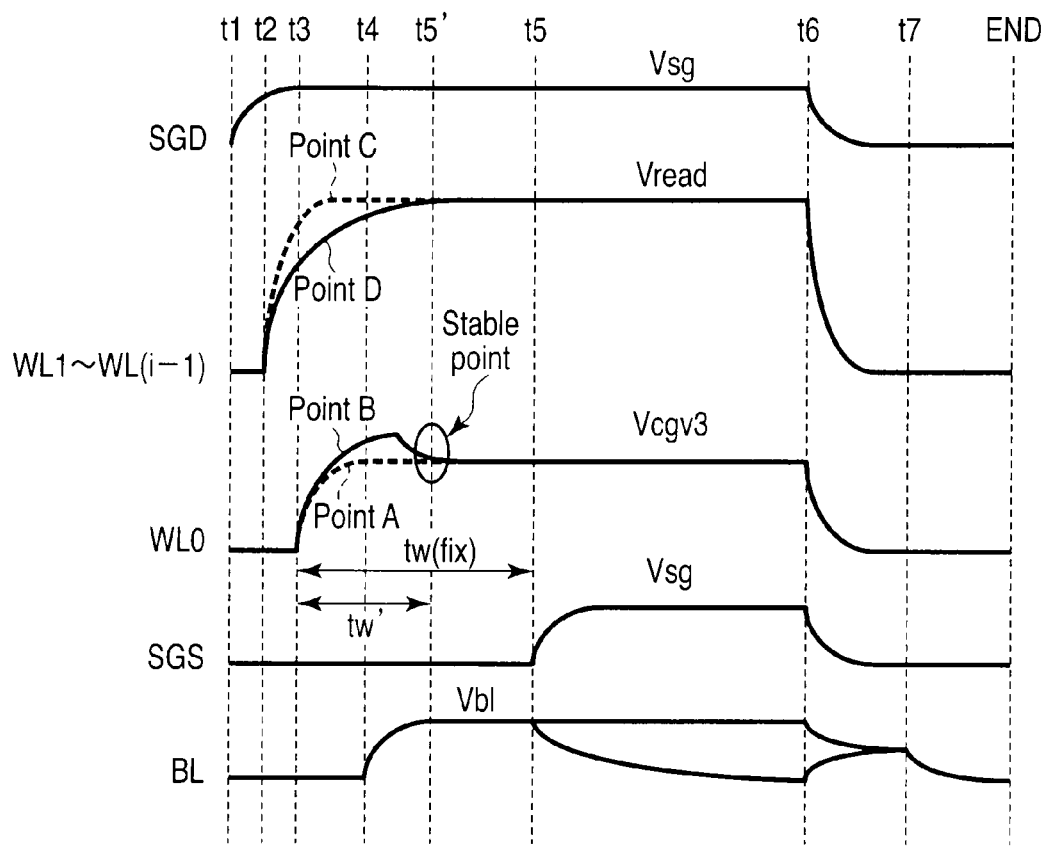
FIG. 6 is a diagram showing a waveform of a selected word line to which Vcgv3 is supplied.

FIG. 6 shows waveforms for when Vcgv3 is supplied to selected word line WL0.

In the waveforms, for selected word line WL0, changes in waveforms at points A and B in the memory cell array are shown in a comparative manner and for non-selected word line WL1, changes in waveforms at points C and D in the memory cell array are shown in a comparative manner.

While Vcgv1 is the lowest value of the selected read potential, Vcgv3 is the highest value of the selected read potential.

What can be seen from the waveforms is that the larger the value of the selected read potential, the closer the stable point is to time t3 (the point in time when the selected read potential begins to be supplied to the selected word line).

However, in the conventional technique, as shown in the drawing, set up term tw (fix) of word lines is fixed to the longest term which is obtained when the selected read potential is Vcgv1, regardless of the value of the selected read potential.

In view of this, the present invention proposes that the set up term of word lines is changed based on the value of the selected read potential.

Specifically, the set up term of word lines is shortened in proportion to an increase of the value of the selected read potential. For example, by shortening the set up term of word lines for when the selected read potential is Vcgv3 to tw', time t5 can be put forward to time t5', enabling to contribute to a high speed of a read operation.

The principle of the present invention has been described above and the same can be said for the following read waveforms.

Figure 7:
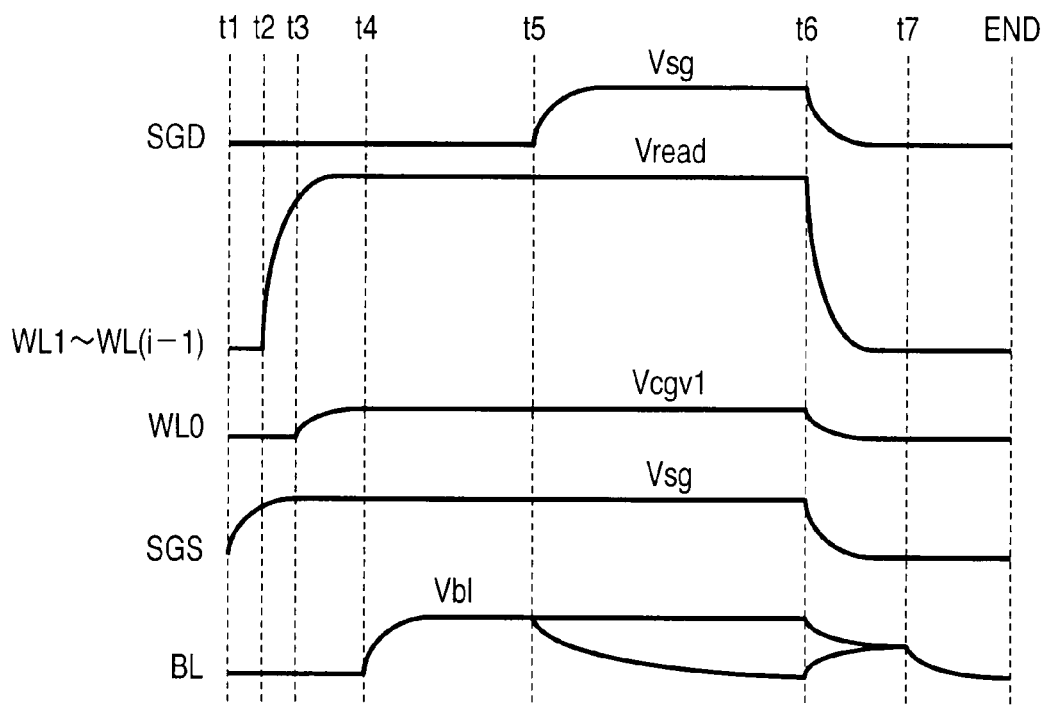
FIGS. 7 and 8 are diagrams, each showing a waveform of a selected word line to which Vcgv1 is supplied.

FIG. 7 shows a third example of waveforms for when Vcgv1 is supplied to selected word line WL0.

In the third example, for selected word line WL0, a change in waveform at point A in the memory cell array is shown and for non-selected word line WL1, a change in waveform at point C in the memory cell array is shown.

The characteristic of the waveforms is that the timing at which the gate potential of the source line side select gate transistor (the potential of select gate line SGS) rises and the timing at which the gate potential of the bit line side select gate transistor (the potential of select gate line SGD) rises are inverse to those in the waveforms in FIG. 4.

Specifically, at time t1 the gate potential of the source line side select gate transistor (the potential of select gate line SGS) begins to rise to Vsg, and at time t5 the gate potential of the bit line side select gate transistor (the potential of select gate line SGD) begins to rise to Vsg.

Other points are the same as those in the waveforms in FIG. 4.

Here, it is also possible to combine the waveforms in FIG. 4 and the waveforms in FIG. 7.

For example, when WL0 is a selected word line, the waveforms in FIG. 7 may be adopted and when one of WL1 to WL(i−1) is a selected word line, the waveforms in FIG. 4 may be adopted.

Alternatively, when one of word lines which are a half of WL0 to WL(i−1) on the source line side is a selected word line, the waveforms in FIG. 7 may be adopted, and when one of word lines which are a half of WL0 to WL(i−1) on the bit line side is a selected word line, the waveforms in FIG. 4 may be adopted.

Figure 8:
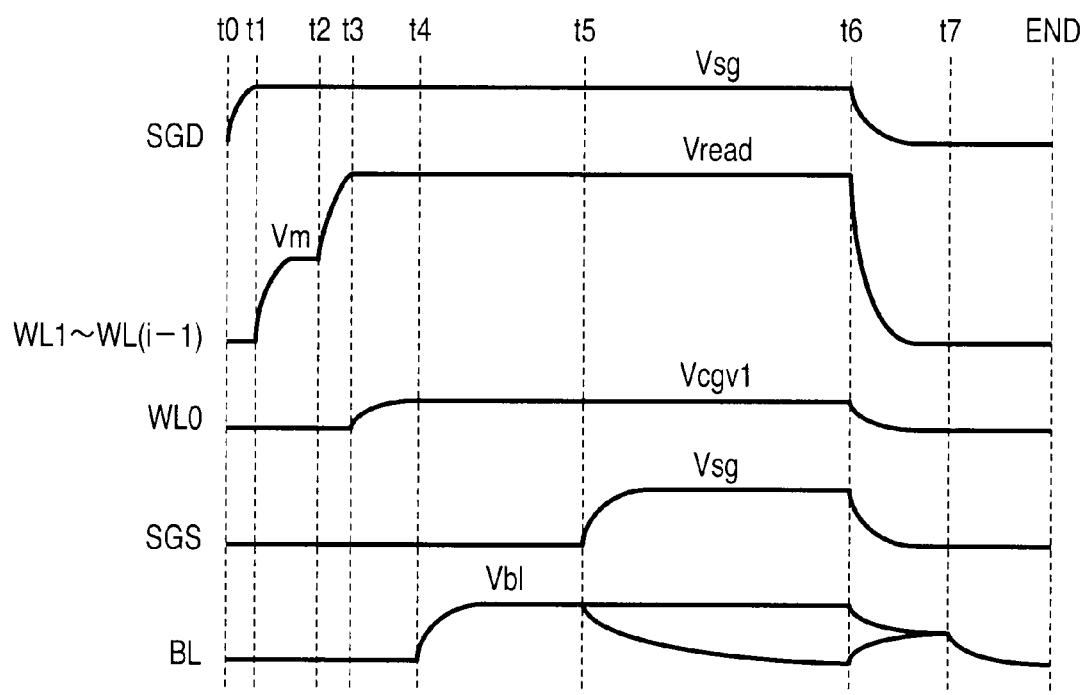

FIG. 8 shows a fourth example of waveforms for when Vcgv1 is supplied to selected word line WL0.

In the fourth example, for selected word line WL0, a change in waveform at point A in the memory cell array is shown and for non-selected word line WL1, a change in waveform at point C in the memory cell array is shown.

The characteristic of the waveforms is that, as compared with the waveforms in FIG. 4, the potentials of non-selected word lines WL1 to WL(i−1) rise to non-selected read potential Vread in steps (e.g., two steps).

Specifically, at time t0, the gate potential of the bit line side select gate transistor (the potential of the select gate line SGD) begins to rise to Vsg. At time t1 the potentials of non-selected word lines WL1 to WL(i−1) begin to rise from ground potential Vss to intermediate potential Vm, and at time t2 the potentials of non-selected word lines WL1 to WL(i−1) further begin to rise from intermediate potential Vm to non-selected read potential Vread.

Other points are the same as those in the waveforms in FIG. 4.

Figure 9:
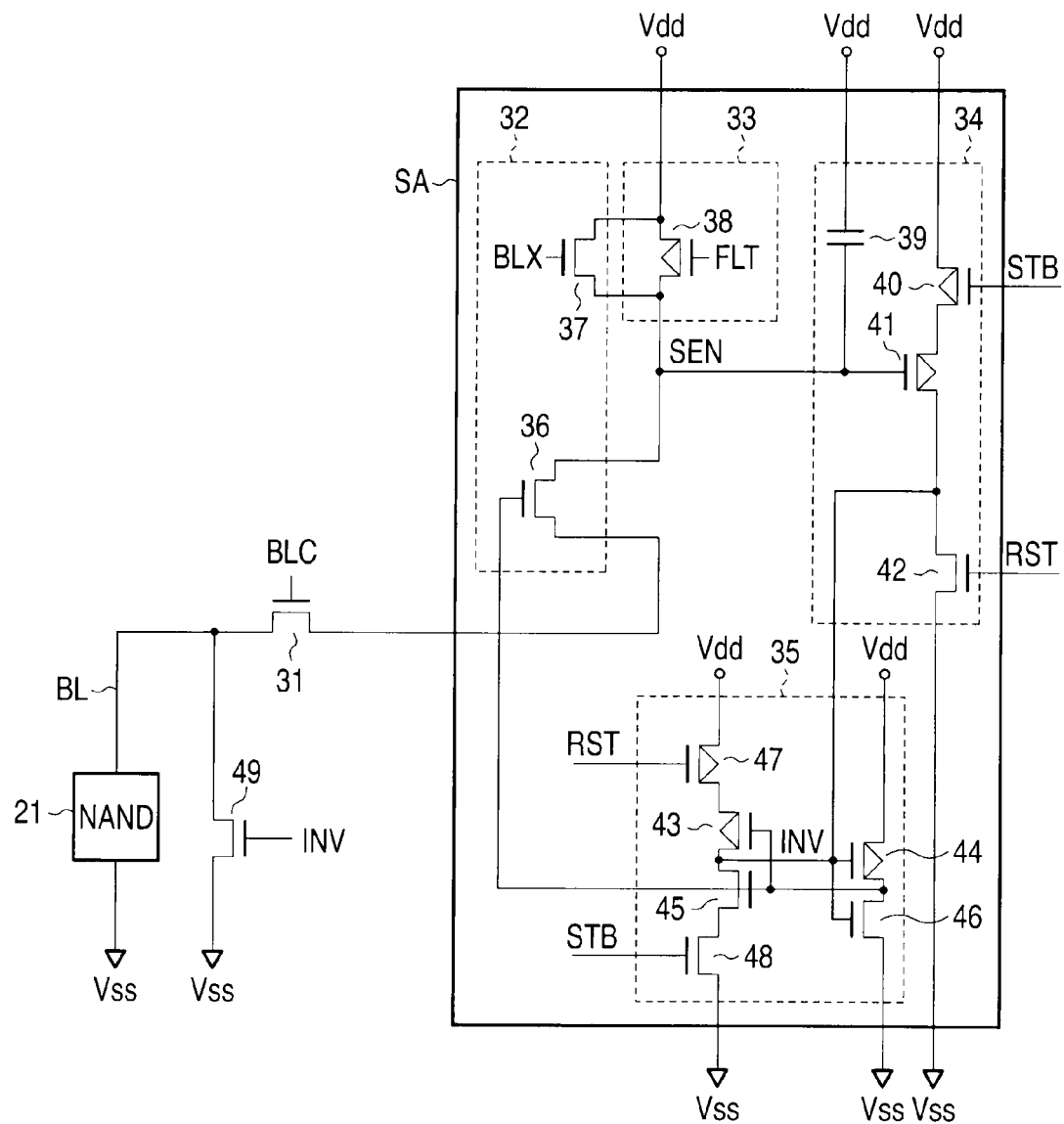
FIG. 9 is a diagram showing a sense amplifier which is applied to a ABL sensing.

FIG. 9 shows an example of a sense amplifier.

Sense amplifier SA is applied to ABL (ALL Bit Line) sensing.

NAND cell unit 21 is connected to sense amplifier SA through clamp circuit 31. Clamp circuit 31 includes an N-channel MOS transistor having a gate to which control signal BLC is to be input.

Sense amplifier SA includes voltage clamp circuit 32, precharge circuit 33, discriminator 34, and latch circuit 35.

Voltage clamp circuit 32 includes N-channel MOS transistors 36 and 37 which are connected in series between power supply terminal Vdd and bit lines BL. An output terminal of latch circuit 35 is connected to a gate of MOS transistor 36 and control signal BLX is input to a gate of MOS transistor 37.

Precharge circuit 33 includes P-channel MOS transistor 38 having a gate to which control signal FLT is to be input. Precharge circuit 33 precharges sense node SEN.

Discriminator 34 includes capacitor 39, P-channel MOS transistors 40 and 41, and N-channel MOS transistor 42. Control signal STB is input to a gate of MOS transistor 40 and control signal RST is input to a gate of MOS transistor 42.

A gate of MOS transistor 41 is connected to sense node SEN.

Latch circuit 35 includes P-channel MOS transistors 43, 44, and 47 and N-channel MOS transistors 45, 46, and 48. MOS transistors 43, 44, 45, and 46 configure two flip-flop connected inverters. Control signal RST is input to a gate of MOS transistor 47 and control signal STB is input to a gate of MOS transistor 48.

FIG. 10 shows a fifth example of waveforms for when Vcgv1 is supplied to selected word line WL0.

In the fifth example, ABL sensing using the sense amplifier in FIG. 9 is adopted.

For selected word line WL0, a change in waveform at point A in the memory cell array is shown and for non-selected word line WL1, a change in waveform at point C in the memory cell array is shown.

First, at time t1, the gate potential of the source line side select gate transistor (the potential of select gate line SGS) and the gate potential of the bit line side select gate transistor (the potential of select gate line SGD) begin to rise to Vsg.

Thereafter, at time t2 the potentials of non-selected word lines WL1 to WL(i−1) begin to rise to Vread, and at time t3 the potential of selected word line WL0 begins to rise to Vcgv1.

At time t4, sense node SEN begins to be charged. Specifically, control signal FLT in FIG. 9 is brought to "L" to charge sense node SEN to Vsen.

Then, at time t5, control signal FLT is brought to "H" and control signal STB is brought to "H" and control signal RST is brought to "L".

At this time, when the threshold voltage of a selected memory cell is lower than selected read potential Vcgv1, the selected memory cell in NAND cell unit 21 in FIG. 9 goes to an on state.

Hence, sense node SEN is discharged and MOS transistor 41 in FIG. 9 goes to an on state. Specifically, "H" is latched in latch circuit 35 and bit lines BL are discharged by N-channel MOS transistor 49.

When the threshold voltage of a selected memory cell is higher than selected read potential Vcgv1, the selected memory cell in NAND cell unit 21 in FIG. 9 goes to an off state.

Hence, sense node SEN maintains Vsen and MOS transistor 41 in FIG. 9 maintains an off state. Specifically, "L" is latched in latch circuit 35.

Finally, at time t6, control signal FLT is brought to "L" to cause the gate potential of the source line side select gate transistor (the potential of select gate line SGS) to fall.

At time t7, the gate potentials of all word lines WL0 to WL(i−1) and bit line side select gate transistor (the potential of select gate line SGD) fall, bringing them to ground potential Vss.

FIG. 11 is a sixth example of waveforms for when Vcgv1 is supplied to selected word line WL0.

In the sixth example, ABL sensing using the sense amplifier in FIG. 9 is adopted.

In the sixth example, for selected word line WL0, changes in waveforms at points A and B in the memory cell array are shown in a comparative manner and for non-selected word line WL1, changes in waveforms at points C and D in the memory cell array are shown in a comparative manner.

Waveforms at points B and D differ from waveforms at points A and C in a range of times t2 to t5. Dashed lines indicate waveforms at points A and C and solid lines indicate waveforms at points B and D.

At time t2, when non-selected read potential Vread is supplied to one ends of respective non-selected word lines WL1 to WL(i−1), at point C which is nearest to the word line driver, the potentials of non-selected word lines WL1 to WL(i−1) suddenly rise and immediately reach Vread.

On the other hand, at point D which is farthest from the word line driver, the potentials of non-selected word lines WL1 to WL(i−1) gradually rise due to the influence of wiring resistance and wiring capacitance.

At time t3, when selected read potential Vcgv1 is supplied to one end of selected word line WL0, at point A the potential of selected word line WL0 immediately reaches Vcgv1. At point B, however, since it requires a considerable amount of time for Vcgv1 to be transmitted from point A to point B, the potential does not immediately reach Vcgv1.

Meanwhile, since the potential of non-selected word line WL1 at point D gradually rises due to the influence of wiring resistance and wiring capacitance, the potential of selected word line WL0 at point B overshoots to near Vread by capacitive coupling between selected word line WL0 and non-selected word line WL1.

Thus, to prevent erroneous reading, sensing cannot begin until the potential at point B drops to Vcgv1 from near Vread. That is, set up term tw (fix) of word lines from when Vcgv1 begins to be supplied to selected word line WL0 until sensing begins is required.

Here, the point in time when the potential at point B reaches Vcgv1 is, as described above, referred to as a "stable point". The potential at point B reaching Vcgv1 indicates that the potential at point B falls within a range of Vcgv1±α. The value of α is, for example, 10% of the value of Vcgv1. If Vcgv1 is 0.5 V, α is 0.05 V.

Figures 12, 13:
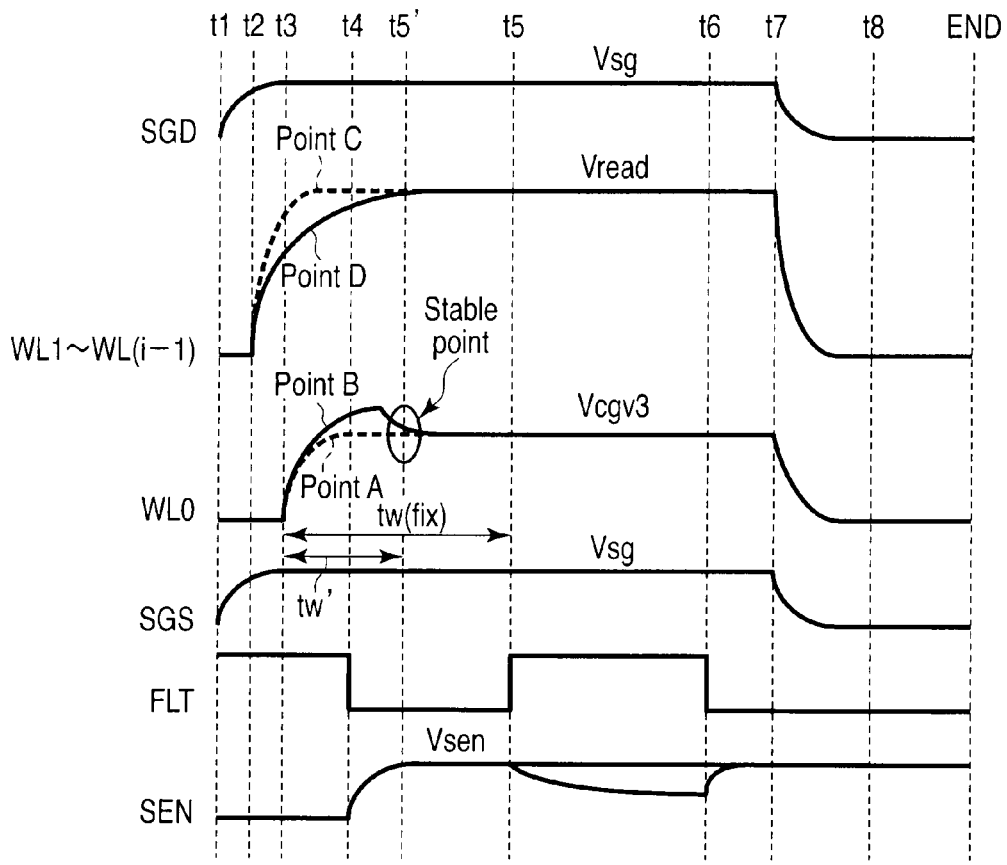
FIG. 12 is a diagram showing a waveform of a selected word line to which Vcgv3 is supplied.
FIG. 13 is a diagram showing a relationship between a selected read potential and a set up term.

FIG. 12 shows waveforms for when Vcgv3 is supplied to selected word line WL0.

The waveforms relate to ABL sensing using the sense amplifier in FIG. 9.

In the waveforms, for selected word line WL0, changes in waveforms at points A and B in the memory cell array are shown in a comparative manner and for non-selected word line WL1, changes in waveforms at points C and D in the memory cell array are shown in a comparative manner.

While Vcgv1 is the lowest value of the selected read potential, Vcgv3 is the highest value of the selected read potential.

What can be seen from the waveforms is that the larger the value of the selected read potential, the closer the stable point is to time t3 (the point in time when the selected read potential begins to be supplied to the selected word line).

However, as described above, in the conventional technique, set up term tw (fix) of word lines is fixed to the longest term which is obtained when the selected read potential is Vcgv1, regardless of the value of the selected read potential.

In view of this, the present invention proposes that the set up term of word lines is changed based on the value of the selected read potential in ABL sensing, too.

Specifically, the set up term of word lines is shortened in proportion to an increase of the value of the selected read potential. For example, by shortening the set up term of word lines for when the selected read potential is Vcgv3 to tw', time t5 can be put forward to time t5', enabling to contribute to a high speed of a read operation.

4. Embodiments

(1) First Embodiment

A first embodiment relates to a normal read operation.

FIG. 13 shows a relationship between a read potential of a selected word line and a set up term.

One memory cell stores n level data (n is a natural number greater than or equal to 3).

In this case, the number of selected read potentials Vcgr is (n−1). They are Vcgr1, Vcgr2, Vcgr3, ... Vcgr(n−1). Note that Vcgr1<Vcgr2<Vcgr3<...Vcgr(n−1).

The set up terms of word lines for selected read potentials Vcgr1, Vcgr2, Vcgr3, ... Vcgr(n−1) are respectively tw1, tw2, tw3, ... tw(n−1). According to an example of the present invention, tw1>tw2>tw3>...tw(n−1).

Figure 14:
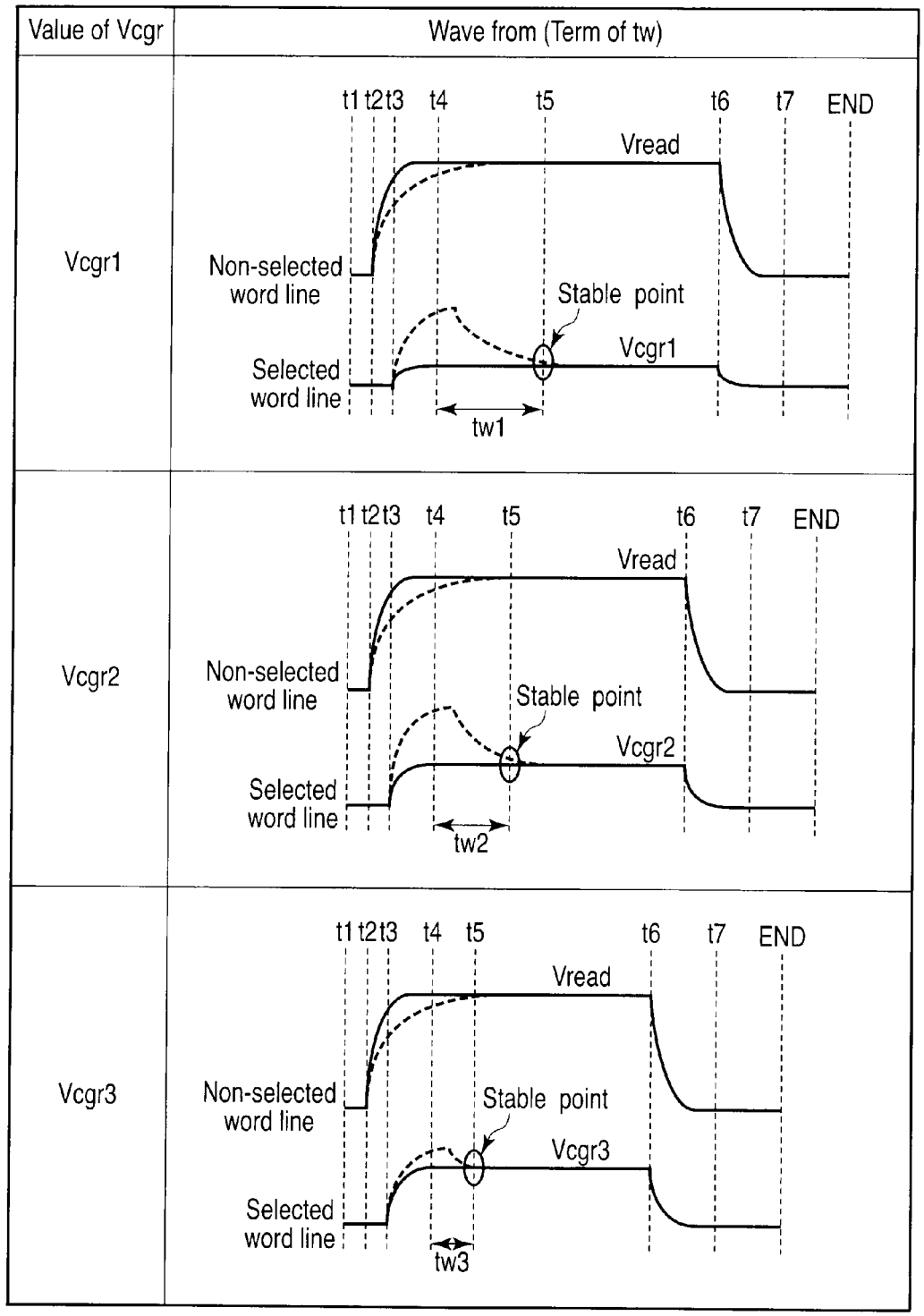
FIG. 14 is a diagram showing a situation of changing a set up term based on a selected read potential.

FIG. 14 shows a situation where the set up term of word lines is shortened in proportion to an increase of the value of the selected read potential.

Times t2 to t5 in the waveforms correspond to times t2 to t5 in the waveforms in FIGS. 4 to 7 and FIGS. 10 to 12.

For example, when set up term tw1 of word lines for when the selected read potential has the lowest value Vcgr1 is used as reference, for every increase of the value of the selected read potential by one level, the set up term of word lines is shortened by about 1 μsec.

Thus, in the example of the present invention, as the number of levels increases (as the number of data to be stored in one memory cell increases), an effect appears more remarkably.

By thus changing set up term tw of word lines based on the value of selected read potential Vcgr, it can contribute to a high speed of a read operation.

(2) Second Embodiment

A second embodiment relates to a verify read operation.

FIG. 15 shows a relationship between a verify read potential of a selected word line and a set up term.

One memory cell stores n level data (n is a natural number greater than or equal to 3).

In this case, the number of selected read potentials Vcgv is (n−1). They are Vcgv1, Vcgv2, Vcgv3, ... Vcgv(n−1). Note that Vogv1<Vcgv2<Vcgv3<...Vcgv(n−1).

The set up terms of word lines for selected read potentials Vcgv1, Vcgv2, Vcgv3, ... Vcgv(n−1) are respectively tw1, tw2, tw3, ... tw(n−1). According to an example of the present invention, tw1>tw2>tw3>...tw(n−1).

Figure 16:
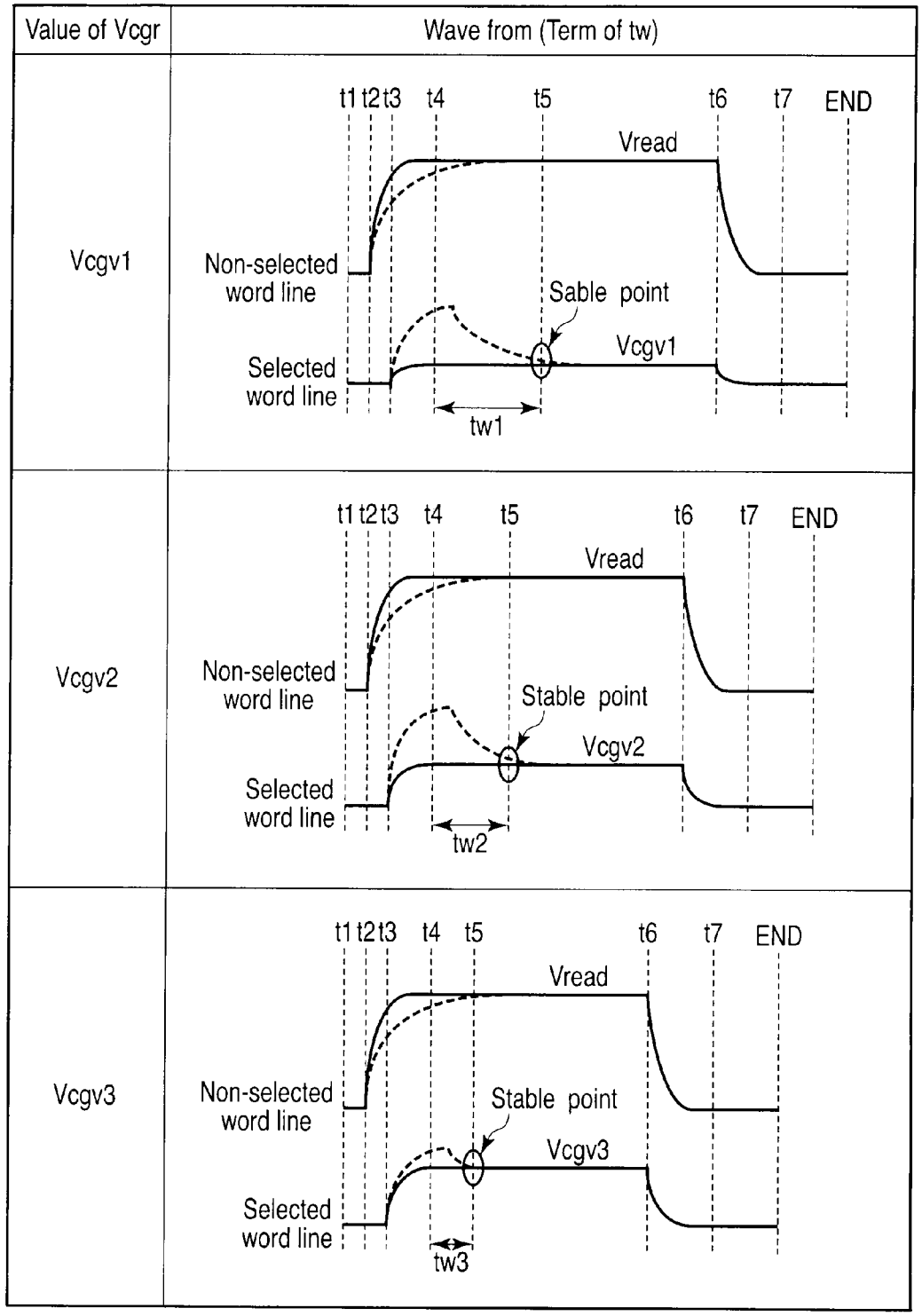
FIG. 16 is a diagram showing a situation of changing a set up term based on a selected read potential.

FIG. 16 shows a situation where the set up term of word lines is shortened in proportion to an increase of the value of the selected read potential.

Times t2 to t5 in the waveforms correspond to times t2 to t5 in the waveforms in FIGS. 4 to 7 and FIGS. 10 to 12.

For example, when set up term tw1 of word lines for when the selected read potential has the lowest value Vcgv1 is used as reference, for every increase of the value of the selected read potential by one level, the set up term of word lines is shortened by about 1 μsec.

Thus, in the example of the present invention, as the number of levels increases (as the number of data to be stored in one memory cell increases), an effect appears more remarkably.

In addition, since as the number of levels increases the number of verifies tends to increase, the example of the present invention is also very effective for such an increase in the number of verifies.

By thus changing set up term tw of word lines based on the value of selected read potential Vcgv, it can contribute to a high speed of a read operation.

5. Application Examples

The examples of the present invention are effective for multi-level NAND flash memories. In addition, the examples of the present invention can be applied to multi-level nonvolatile semiconductor memories in general which have memory cells, each storing three or more level data.

6. Conclusion

According to the present invention, by devising the setting of a set up term of word lines, a high speed of a read operation can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-level nonvolatile semiconductor memory comprising:
   first and second select gate transistors;
   memory cells each stores three or more level data, which are connected in series between the first and second select gate transistors;
   a selected word line which is connected to a selected memory cell as a target of a reading among the memory cells;
   a non-selected word line which is connected to a non-selected memory cell except the selected memory cell among the memory cells;
   a potential generating circuit for generating a selected read potential which is supplied to the selected word line, and generating a non-selected read potential larger than the selected read potential, which is supplied to the non-selected word line; and
   a control circuit which changes a set up term of the selected word line and the non-selected word line based on a value of the selected read potential, wherein the value of the selected read potential is selected from two or more potentials.

2. The memory according to claim 1, wherein the control circuit makes the set up term shorter in proportion to an increase of the value of the selected read potential.

3. The memory according to claim 1, wherein the potential generating circuit generates the non-selected read potential after generating an intermediate potential which is larger than a ground potential and is smaller than the non-selected read potential.

4. The memory according to claim 1, wherein the first select gate transistor is connected to a source line, the second select gate transistor is connected to a bit line, and the second select gate transistor turns on after the first select gate transistor turns on.

5. The memory according to claim 1, wherein the first select gate transistor is connected to a source line, the second select gate transistor is connected to a bit line, and the first and second select gate transistors turn on at the same time.

6. The memory according to claim 1, wherein each of the memory cells stores four level data.

7. The memory according to claim 6, wherein the reading is a verify reading.

8. The memory according to claim 7, wherein the value of the selected read potential is selected from three verify read potentials.

9. The memory according to claim 1, further comprising a sense amplifier applied to a ABL sensing.

10. The memory according to claim 1, wherein the memory is a NAND flash memory.

11. The memory according to claim 1, further comprising a sense amplifier including a precharge circuit, wherein the precharge circuit comprises a p-channel MOS transistor connected between a sense node and a power supply terminal.

12. The memory according to claim 11, wherein the p-channel MOS transistor turns on, after the first and second select gate transistors turn on.

13. The memory according to claim 5, further comprising a sense amplifier including a precharge circuit, wherein the precharge circuit comprises a p-channel MOS transistor connected between a sense node and a power supply terminal.

14. The memory according to claim 13, wherein the p-channel MOS transistor turns on, after the first and second select gate transistors turn on.

15. The memory according to claim 1, wherein the set up term of the selected word line is a term from when a selected read potential begins to be supplied to the selected word line until sensing begins.

* * * * *